United States Patent [19]

Shaheen

[11] 4,423,467
[45] Dec. 27, 1983

[54] CONNECTION ARRAY FOR INTERCONNECTING HERMETIC CHIP CARRIERS TO PRINTED CIRCUIT BOARDS USING PLATED-UP PILLARS

[75] Inventor: Joseph M. Shaheen, La Habra, Calif.

[73] Assignee: Rockwell International Corporation, El Segundo, Calif.

[21] Appl. No.: 216,745

[22] Filed: Dec. 15, 1980

[51] Int. Cl.³ .............................................. H05K 1/18
[52] U.S. Cl. ............................... 361/403; 174/52 FP; 174/68.5; 361/406; 361/409
[58] Field of Search .................... 174/68.5, 52 FP; 361/03, 406, 409, 404

[56] References Cited

U.S. PATENT DOCUMENTS

| | | | |
|---|---|---|---|
| 2,771,663 | 11/1956 | Henry | 174/68.5 |
| 2,971,138 | 2/1961 | Meisel | 174/52 FP |
| 3,386,009 | 5/1968 | Grabbe | 361/406 |
| 3,464,855 | 9/1969 | Shaheen et al. | 174/68.5 |
| 3,500,538 | 3/1970 | Raciti | 174/68.5 X |
| 3,781,596 | 12/1973 | Galli | 361/409 X |
| 3,964,087 | 6/1976 | Mallon | 174/68.5 X |

FOREIGN PATENT DOCUMENTS

| | | | |
|---|---|---|---|
| 1158135 | 11/1963 | Fed. Rep. of Germany | 174/68.5 |
| 1246289 | 9/1971 | United Kingdom | 361/403 |

*Primary Examiner*—R. R. Kucia
*Attorney, Agent, or Firm*—H. Fredrick Hamann; Wilfred G. Caldwell

[57] ABSTRACT

The invention comprises a connection array for establishing a plurality of electrical connections between circuit pads of a support, such as a circuit board, and contacts of an electrical housing, such as a hermetic chip carrier, wherein the contacts comprise semi-circular vertical indentations in the housing periphery with each indentation having a conductive layer therein. A plurality of pillars, which may be electroplated, extend vertically above the support in an array respectively corresponding to the outline of the indentations with each pillar being connected to different pad of the support and the pillars having dimensions to permit at least partial entry into the indentations whereby solder may be introduced between the pillars and associated conductive layers to establish visible and inspectable electrical connections therebetween.

2 Claims, 9 Drawing Figures

CONNECTION ARRAY FOR INTERCONNECTING HERMETIC CHIP CARRIERS TO PRINTED CIRCUIT BOARDS USING PLATED-UP PILLARS

FIELD OF THE INVENTION

The subject invention relates to apparatus for connecting a plurality of electrical circuits on a support to circuitry included in a housing by virtue of semicircular indentations in the housing sidewalls having conductive layers therein extending to the internal circuitry thereof.

BACKGROUND OF THE INVENTION INCLUDING PRIOR ART

The subject invention establishes upstanding pillars corresponding to the semicircular indentation for connection by solder therebetween to establish the connection array whereas the prior art never utilizes the semiconductor indentations with conductive layers, but rather uses horizontal extensions of the layers beneath the housing for direct connection to circuitry of the support board without any pillars which totally obscures the connections and prevents inspection.

SUMMARY OF THE INVENTION

The subject invention comprises a connection array and method for establishing a plurality of electrical connections between circuit pads of a support and contacts of an electrical housing wherein the contacts comprise semicircular vertical indentations in the housing periphery with each indentation having a conductive layer therein. A plurality of pillars is located on the support and extends vertically thereabove in an array respectively corresponding to the outline of the indentations with each pillar being connected to a different pad of the support and the pillars have horizontal dimensions to permit entry at least partly into said indentations whereby solder introduced between the pillars and the conductive layers establishes electrical connections therebetween.

DESCRIPTION OF THE PREFERRED EMBODIMENT

Figure 1:
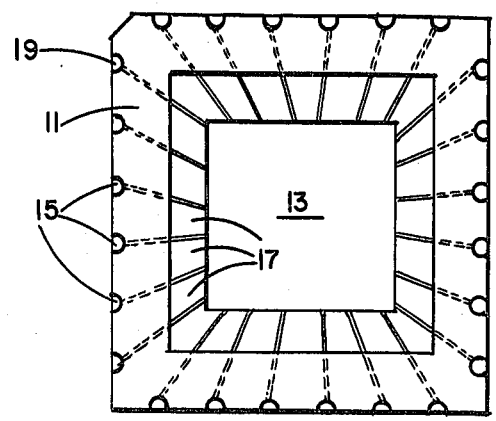
FIG. 1 is a top plan view of the sealing ring of a conventional hermetic chip carrier.
Figure 2:
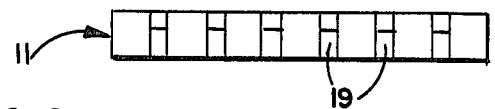
FIG. 2 is an end view of the structure of FIG. 1.
Figure 3:
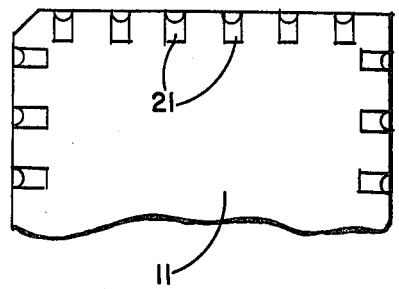
FIG. 3 is a bottom plan view of the structure of FIG. 1.

The prior art is best described in connection with the conventional sealing ring of the well known hermetic chip carriers as depicted in FIGS. 1–3. In FIG. 1 sealing ring 11 includes die cavity 13, a plurality of semicircular peripheral indentations 15 and electrical connections 17 extending from conductive layers 19 of the indentations 15 to the carrier bonding pads 21 located on the bottom of the sealing ring 11.

Currently, the bonding pads 21 are connected directly to circuit board pads of the printed circuit thereby obscuring the interconnections. This is accomplished by silkscreening solder paste on the circuit board pads, positioning the hermetic chip carrier or at least the sealing ring therefore on the solder paste with the carrier pads in contact with the circuit board pads and reflowing the solder to establish the respective electrical connections therebetween. Thus, it may be appreciated that the indentations with their conductive layers 19 are not used.

The disadvantages of the prior art interconnections are first the solder joints are not visible and thus cannot be inspected. The only clue to poor connections on the inspection line is a cocked assembly but lesser imperfections cannot be detected. Also, it is impossible to clean under the hermetic chip carrier package to eliminate solder paste or flux.

Further, it has been found that shear forces are the most damaging forces encountered with respect to the interconnections between the hermetic chip carriers and the circuit wiring boards. The expansion coefficient of the ceramic package and the organic board materials are different and the solder joints are readily cracked. This is particularly emphasized as the package sizes increase.

In contrast with the present invention, the pillars fit the grooves and are not necessarily all the way into the groove such that the solder joints may be inspected. Normally, if the solder has freeflowed on the outside of the pillar, the joint was heated sufficiently to be electrically useful. Actually, solder surrounds the pillar and makes a large junction between the pillar and the conductive layer of the indentations. In such a structure, the force is changed from shear to compressive and tensile stresses which are less severe on the solder joints and, actually no shear forces are present with respect to the joint itself such that the yield is substantially increased as a result of the present invention.

Also automation may be introduced as a result of the structure of the present invention because the pillars fit all four sides of the hermetic chip carrier to permit automatic positioning and even automatic soldering.

The invention is equally applicable to ceramic circuit boards, multi-layered boards, printed wiring boards and printed circuit boards.

Figure 4:
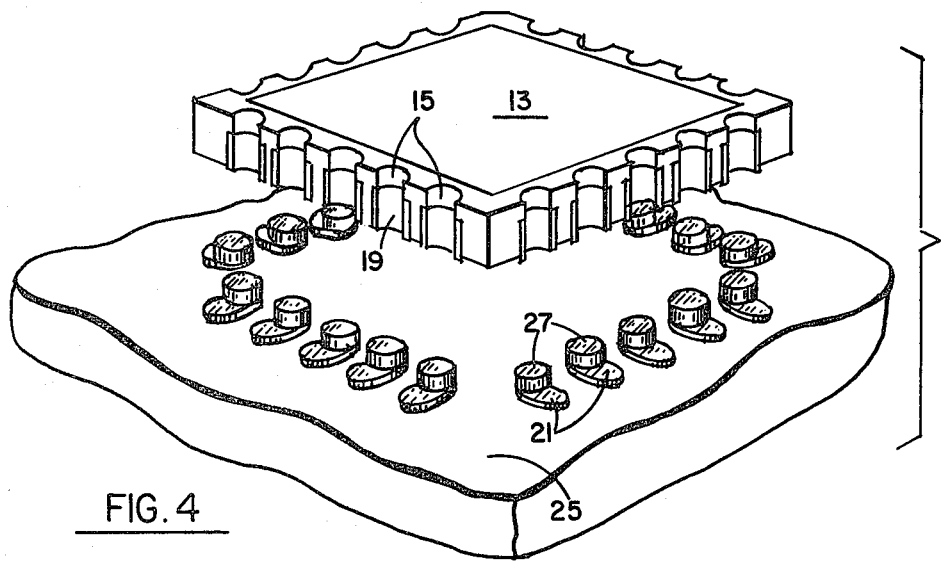
FIG. 4 is a view in perspective of the sealing ring of a hermetic chip carrier with receiving indentations poised above circuit board with uprising pillars connected to respective pads thereof.

Turning now to FIG. 4 the circuit board is indicated at 25 with pads being visible at 21 and pillars indicated at 27 in the electrical connection thereto. The sealing ring 13 has the openings 15 layered with conductive metal shown as the conductors 19, with the array of pillars 27 generally in the outline of the semicircular openings 15 for association respectively therewith.

It is preferable to electroplate the pillars directly onto the bonding pads 21 thereby preserving alignment and establishing electrical connections therebetween.

Figure 5:
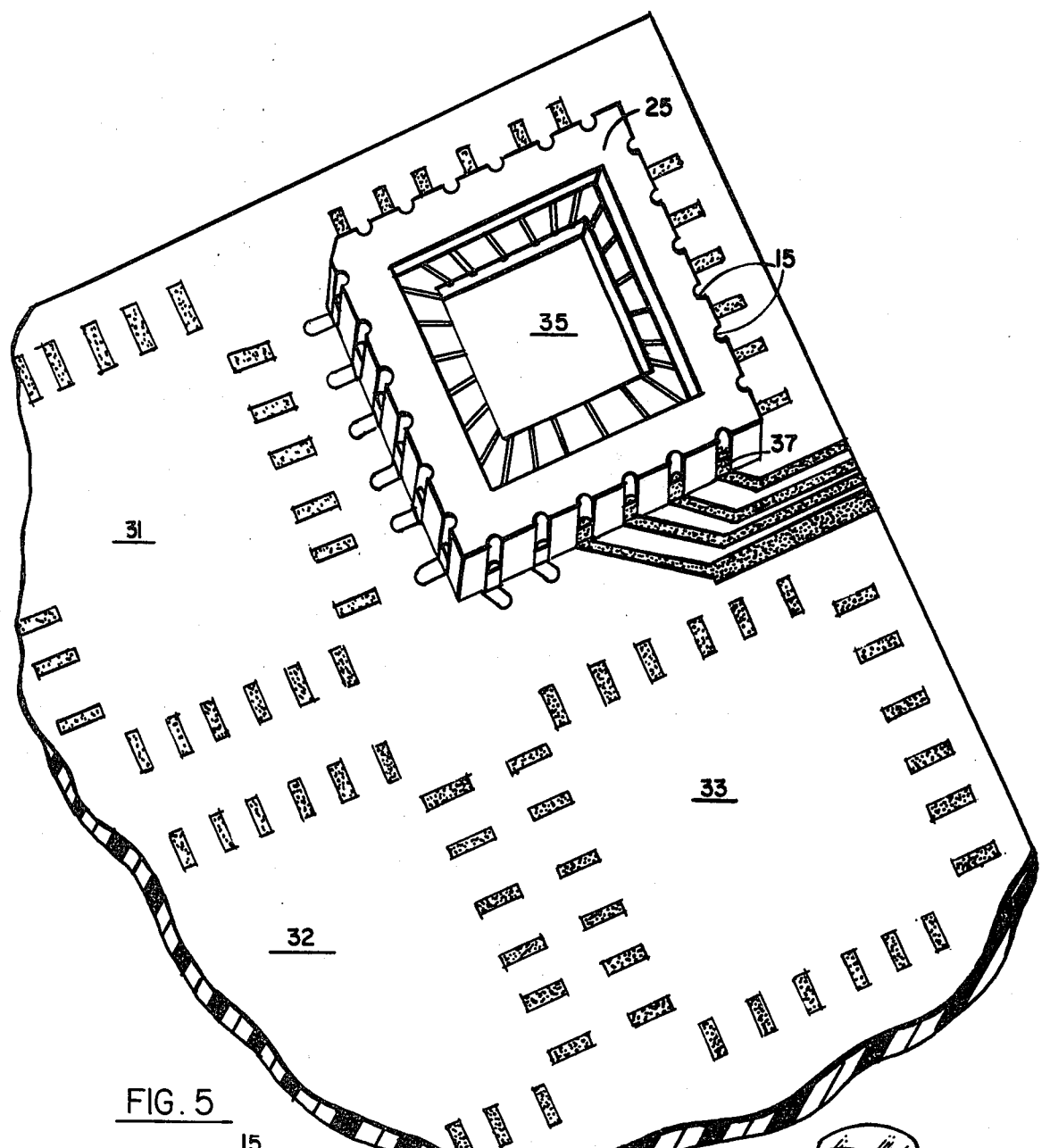
FIG. 5 is a view of a circuit board with a hermetic chip carrier sealing ring connected thereto utilizing the subject invention.

In FIG. 5 a printed circuit board 25 has 3 unoccupied hermetic chip carrier positions 31, 32 and 33 and it has one chip carrier sealing ring 35 connected thereto in accordance with the present invention. It is possible to see the solder connections 37 in the regions of the semicircular openings 15. Thus, each solder joint is available for inspection.

Figure 6:
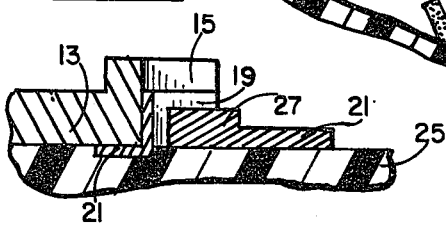
FIG. 6 is a cross-sectional view through a semicircular opening of the chip carrier sealing ring with a pillar connected to a pad partly introduced thereinto.
Figure 7:
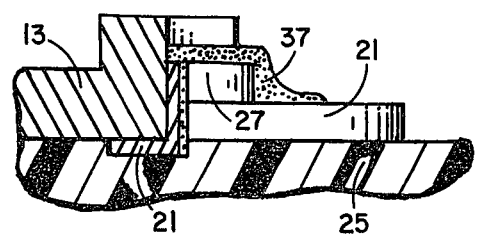
FIG. 7 is a view similar to FIG. 6 showing the addition of solder connecting the conductive layer of the semicircular indentation to the pillar of the circuit board.

In FIG. 6 the cross-sectional view shows circuit board 25 with pad 21 and pillar 27 formed thereon top. Pillar 27 is shown partially within semicircular vertical indentation 15 and having height substantially corresponding to the height of the sleeve conductor 19. Also, the hermetic chip carrier pad 21 is visible as well as a portion of sealing ring 13. Note the spacing between the components which leaves ample space for the solder 37, best seen in FIG. 7. The solder flows inwardly of pillar 27 to fill the spacing between conductor 21 and pillar 27 and also outwardly of the pillar 27 and onto the upper surface of pad 21.

Figure 8:
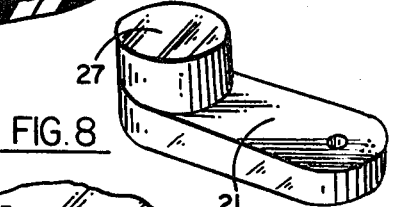
FIG. 8 is a view in perspective of the preferred embodiment of the pillar in connection with a pad of the circuit board; and, FIG. 9 shows a modified form of pillar which is rectangular rather than cylindrical also connected to a pad of the circuit board.

In FIG. 8 there is shown a perspective view of the plated pillar 27 relative to the circuit board pad 21 to which it is electrically connected.

Figure 9:
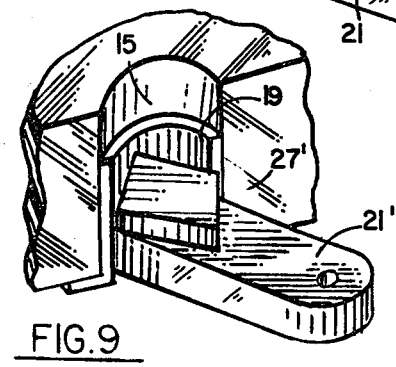

In FIG. 9 an alternative pillar 27' is shown rising from pad 21' and assuming a rectangular configuration. This configuration partially fits within the semicircular opening 15' including conductive layer 19'. Solder will fill the space between these two components and establish electrical connection therebetween, spilling over the pillar 27' onto the pad 21' to indicate a good or poor solder joint depending on appearance.

While the drawings show the electrical housing in the form of only the sealing ring, it will be realized that a chip is included within the ring and a hermetically sealed closure member mates with the ring. Normally, such completed hermetically sealed chip carrier housings are purchased for assembly together with the boards having the pillars in accordance with the subject invention to comprise the interconnecting array and novel process.

While various modifications of the invention will occur to those skilled in the art from a reading of the description hereof, it is intended that the scope of the invention be limited by the appended claims wherein;

What is claimed is:

1. A connection array for establishing a plurality of electrical connections between circuit pads of a circuit board support and contacts of a hermetically sealed chip carrier housing wherein said contacts comprise semicircular vertical indentations in the housing horizontal edge periphery, each indentation having a conductive layer therein, comprising, in combination:

a plurality of pillars extending vertically above said circuit board support in an array respectively corresponding to said indentations;

said pillars being carried by different pads of said support, respectively;

said pillars having horizontal dimensions to permit entry partly into said indentations and collectively to position and mechanically locate said chip carrier housing;

solder between said pillars and said conductive layers establishing electrical connections therebetween free of shear stress as a result of different coefficients of expansion of the circuit board and chip carrier housing; and, said solder being visible in said indentations and externally of said pillars for inspection and cleaning.

2. The array of claim 1, wherein, said pillars are plated up on the inner end portions of said pads and freely enter said indentations whereby said circuit board support directly supports said chip carrier housing.

* * * * *